(12) United States Patent
Keshavarzi et al.

(10) Patent No.: US 7,280,425 B2
(45) Date of Patent: Oct. 9, 2007

(54) DUAL GATE OXIDE ONE TIME PROGRAMMABLE (OTP) ANTIFUSE CELL

(75) Inventors: Ali Keshavarzi, Portland, OR (US); Fabrice Paillet, Hillsboro, OR (US); Muhammad M. Khellah, Tigard, OR (US); Dinesh Somasekhar, Portland, OR (US); Yibin Ye, Portland, OR (US); Stephen H. Tang, Pleasanton, CA (US); Mohsen Alavi, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 11/239,903

(22) Filed: Sep. 30, 2005

(65) Prior Publication Data

US 2007/0076463 A1    Apr. 5, 2007

(51) Int. Cl.
*G11C 17/18*    (2006.01)
(52) U.S. Cl. ............................. 365/225.7; 365/185.13; 365/185.26; 365/96

(58) Field of Classification Search ............. 365/225.7, 365/185.13, 185.26; 36/96
See application file for complete search history.

(56) References Cited

U.S. PATENT DOCUMENTS 6,243,294 B1 *  6/2001  Rao et al. ............... 365/185.14

* cited by examiner

*Primary Examiner*—Van Thu Nguyen
*Assistant Examiner*—Pho M. Luu
(74) *Attorney, Agent, or Firm*—Blakely, Sokoloff, Taylor & Zafman LLP

(57) ABSTRACT

A one-time programmable (OTP) cell includes an access transistor coupled to an antifuse transistor. Access transistor has a gate oxide thickness that is greater than the gate oxide thickness of the antifuse transistor so that if the antifuse transistor is programmed, the voltage felt across the gate/drain junction of the access transistor is insufficient to cause the gate oxide of the access transistor to break down. The dual gate oxide OTP cell may be used in an array in which only one OTP cell is programmed at a time. The dual gate oxide OTP cell also may be used in an array in which several OTP cells are programmed simultaneously.

19 Claims, 7 Drawing Sheets

400

600

DUAL GATE OXIDE ONE TIME PROGRAMMABLE (OTP) ANTIFUSE CELL

BACKGROUND

1. Field

Embodiments of the present invention relate to integrated circuits and, in particular, to one time programmable integrated circuits.

2. Discussion of Related Art

One time programmable (OTP) circuits may be used in integrated circuit (IC) devices for a variety of functions. Traditional one time programmable antifuse circuits have limitations, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

Figure 1:
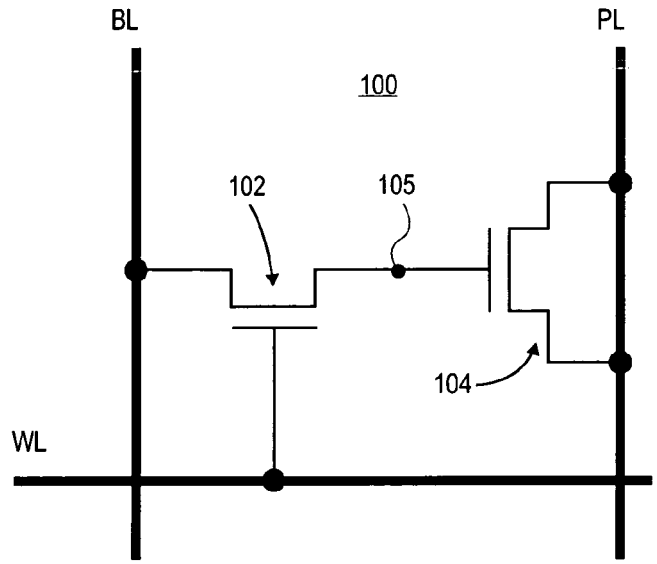
FIG. 1 is a schematic diagram of a one time programmable antifuse cell according to an embodiment of the present invention.

FIG. 1 is a schematic diagram of a dual gate oxide thickness one time programmable antifuse cell 100 according to an embodiment of the present invention. In the illustrated embodiment, the antifuse cell 100 includes a transistor 102 coupled to a transistor 104, which is coupled in a metal oxide semiconductor (MOS)-capacitor configuration. A bit line (BL) is coupled to the source of the transistor 102. A word line (WL) is coupled to the gate of the transistor 102. The drain of the transistor 102 is coupled to the gate of the transistor 104. A program line (PL) is coupled to the source and the drain of the transistor 104. The transistors 102 and 104 share a node (shared node 105) at the transistor 102's drain and the transistor 104's gate.

In the illustrated embodiment, the example transistor 102 is an access transistor and the transistor 104 is the antifuse element. The word line may control the gate of the access transistor 102. The bit line and the program line may be used to program the antifuse cell 100.

The gate oxide of the access transistor 102 may be thick relative to the gate oxide of the antifuse transistor 104. For example, the gate oxide of the access transistor 102 may be thick enough to sustain maximum voltage of the technology for the oxide and the maximum voltage ($V_{MAX}$) of the thick gate oxide of the 102 may be larger than the breakdown voltage of the gate oxide of the antifuse transistor 104. Also, once the antifuse transistor 104 is programmed or blown, the gate oxide of the access transistor 102 may be thick enough to withstand the difference in potential between the voltage that will be present on the shared node 105 (and the drain of the access transistor 102) and the voltage present on the word line (and the gate of the access transistor 102 or $V_{GD}$). Thus, the antifuse cell 100 may be termed a dual gate oxide thickness one time programmable cell.

Figure 2:
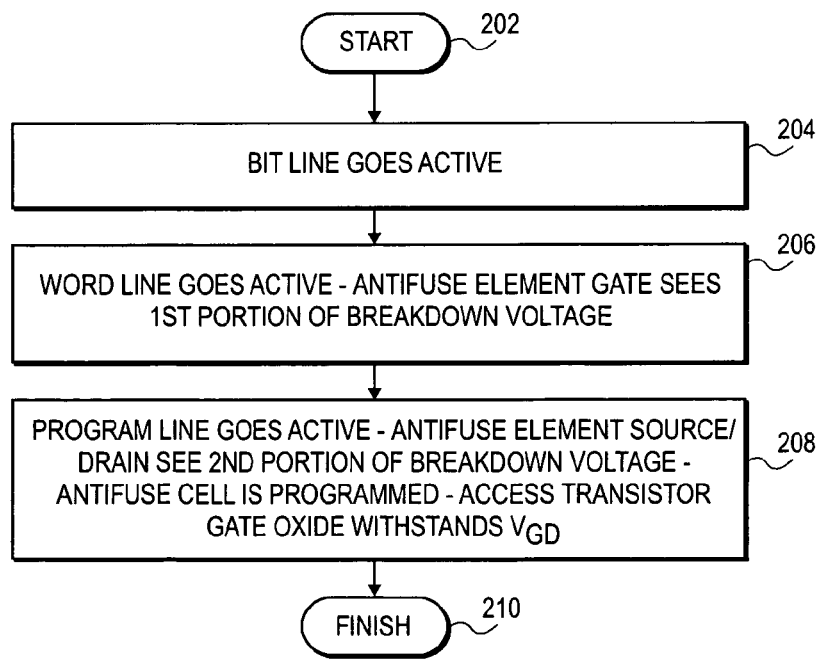
FIG. 2 is a flowchart illustrating a method of operating the cell depicted in FIG. 1 according to an embodiment of the present invention.

To illustrate this point, refer to FIG. 2, which is a flowchart illustrating a method 200 of operating the cell 100 according to an embodiment of the present invention. Assume for purposes of illustration that to program the cell 100, a difference in potential between the gate and the source of the antifuse transistor 104 of less than or equal to approximately three volts (3V) may break down the thin gate oxide of the antifuse transistor 104. Also for the purposes of illustration assume that to turn on the access transistor 102 there should be a difference in potential between the gate and the source of the access transistor 102 of 0.5 volts so that the threshold voltage of thick gate oxide transistor is +0.5V. Assume further for the purposes of illustration that the junction breakdown of the technology may be greater than or equal to three volts (3V).

The method 200 begins with a block 202, where control passes to a block 204.

In block 204, the bit line may go active. In one embodiment, 2.5V may be applied to the bit line, using a bit line driver (not shown), for example.

In a block 206, the word line may go active. In one embodiment, 3.0V may be applied to the word line to turn on the access transistor 102 using a word line driver (not shown), because its threshold voltage is 0.5V and the access transistor 102 sees (3.0V–2.5V) or +0.5V), for example. Applying 2.5V) to the bit line and 3.0V to the word line may result in two volts (2V) being transferred and present on the shared node 105, which, in keeping with the example, is not enough to break down the gate oxide of the antifuse transistor 104 to program the antifuse transistor 104.

In a block 208, the program line may go active. In one embodiment, –0.5V) may be applied to the program line, using a program line driver (not shown), for example. Applying –0.5V) to the program line along with the two volts (2V) present on the shared node 105 results in a difference in potential between the gate and the source/drain of the antifuse transistor 104 of 2.5V), which, in keeping with the example, may be sufficient to break down the thin gate oxide of the antifuse transistor 104 to program (short) the antifuse transistor 104 to a conducting low impedance short connecting the shared node 105 essentially to the program line.

Once the antifuse transistor 104 is programmed or blown, the gate oxide of the access transistor 102 may be thick enough to withstand the difference in potential between the –0.5V from the program line that is now present on the shared node 105 (and the drain of the access transistor 102) and the 3.0V present on the word line. This means that the access transistor 102 may have a gate oxide thickness that can withstand the maximum voltage of the technology for the oxide, which, in keeping with the example is at least 3.5 volts and/or approximately 4.0V. This also means that the voltage on the shared node 105 may not be sufficient to cause the source/drain to body junction of the access transistor 102 to break down. In this manner, the sharing of the three volts between the bit line and the program line may shield affected circuitry (not shown) from the at least 3.5 volts.

Of course, embodiments of the present invention are not limited to the values used in the illustrated embodiment. For example, the voltages used may be based on the available dual oxide thicknesses that the technology implementing the antifuse cell 100 provides. In a block 210, the method 200 finishes.

Figure 3:
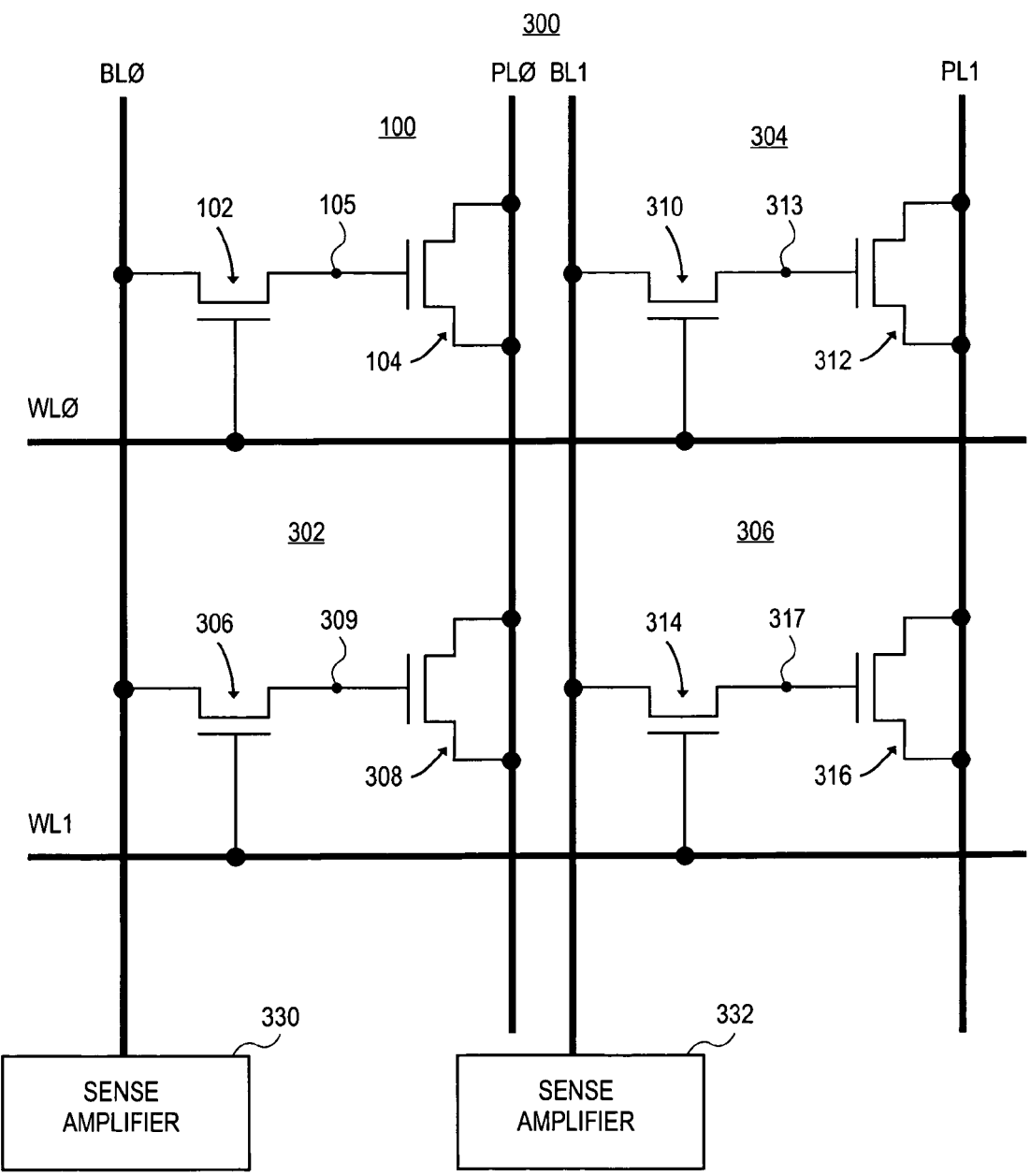
FIG. 3 is a schematic diagram of a one time programmable antifuse array according to an embodiment of the present invention.

FIG. 3 is a schematic diagram of a dual gate oxide thickness one time programmable antifuse array 300 according to an embodiment of the present invention. The illustrated embodiment includes the antifuse cell 100 coupled to three other antifuse cells 302, 304, and 306. In the illustrated embodiment, the example transistors 306, 310, and 314 are thick gate oxide access transistors and the transistors 308, 312, and 316 are the thin gate oxide antifuse transistors.

In the example embodiment, the antifuse cells 302, 304, and 306 are substantially similar to the antifuse cell 100. For purposes of explanation, the transistors in the antifuse cells 302, 304, and 306 are given differing reference numbers. For example, in the illustrated embodiment, the antifuse cell 302 includes an access transistor 312 coupled to an antifuse transistor 314. The antifuse cell 304 includes an access transistor 316 coupled to an antifuse transistor 318. The antifuse cell 306 includes an access transistor 314 coupled to an antifuse transistor 316.

Just as the drain of the transistor 102 is coupled to the gate of the transistor 104 and the transistors 102 and 104 share the shared node 105 at the transistor 102's drain and the transistor 104's gate, the transistors 306 and 308 share a node (shared node 309) at the transistor 306's drain and the transistor 308's gate, the transistors 310 and 312 share a node (shared node 313) at the transistor 310's drain and the transistor 312's gate, and the transistors 314 and 316 share a node (shared node 317) at the transistor 314's drain and the transistor 316's gate.

A bit line zero (BL0) is coupled to the source of the transistor 102 and to the source of the transistor 306. A word line zero (WL0) is coupled to the gate of the transistor 102 and to the gate of the transistor 310. A program line zero (PL0) is coupled to the source and the drain of the transistor 104, and to the source and the drain of the transistor 308.

A bit line one (BL1) is coupled to the source of the transistor 310 and to the source of the transistor 314. A word line one (WL1) is coupled to the gate of the transistor 306 and to the gate of the transistor 314. A program line one (PL1) is coupled to the source and the drain of the transistor 312, and to the source and the drain of the transistor 316.

The bit line zero (BL0) and the program line zero (PL0) may be used program the antifuse cells 100 and 302. The word line zero (WL0) may control the gate of the access transistor 102 and the word line one (WL1) may control the gate of the access transistor 306 to select either the antifuse cell 100 or 302, respectively, to be programmed.

The bit line one (BL1) and the program line one (PL1) may be used program the antifuse cells 304 and 306. The word line zero (WL0) may control the gate of the access transistor 310 and the word line one (WL1) may control the gate of the access transistor 314 to select either the antifuse cell 304 or 306, respectively, to be programmed.

A sense amplifier 330 is coupled to the bit line zero (BL0) and 332 a sense amplifier 332 is coupled to the bit line one (BL1). The sense amplifier 330 may sense data on the bit line zero (BL0) and the sense amplifier 330 may sense data on the bit line one (BL1).

Figure 4:
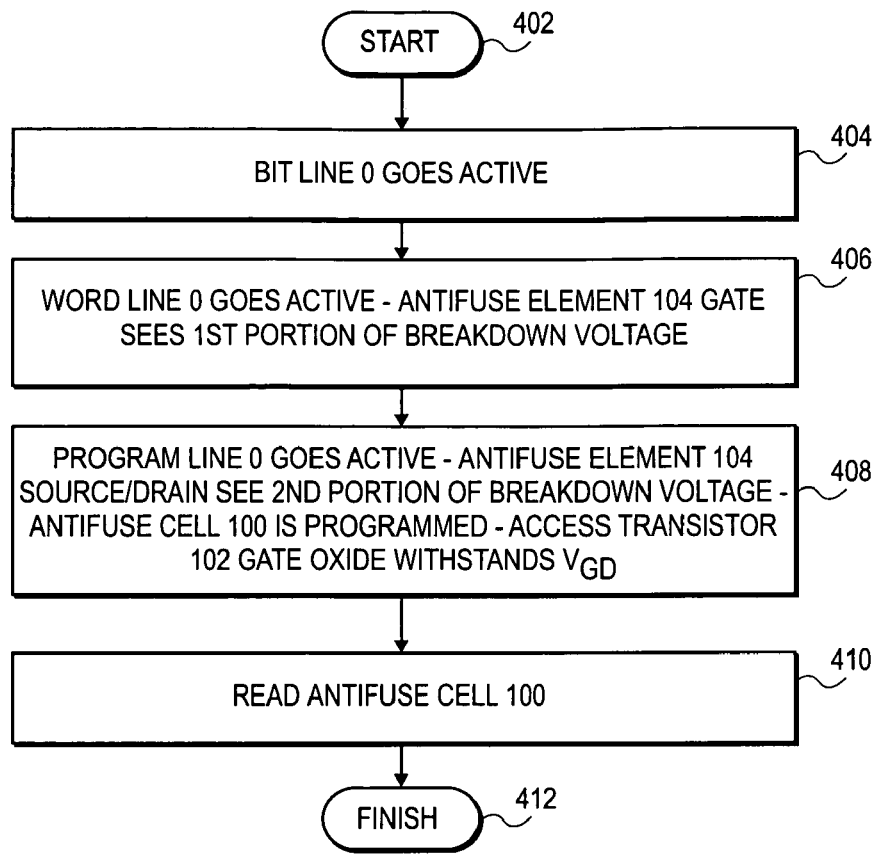
FIG. 4 is a flowchart illustrating a method of operating the array depicted in FIG. 3 according to an embodiment of the present invention.

FIG. 4 is a flowchart illustrating a method of operating the cell 300 according to an embodiment of the present invention in which we wish to program the antifuse cell 100 and do not want to program the antifuse cells 302, 304 306, or 306.

The method 400 begins with a block 402, where control passes to a block 404. In block 404, the bit line zero (BL0) may go active. In one embodiment, two volts (2V) may be applied to the bit line zero (BL0). In a block 406, the word line zero (WL0) may go active. In one embodiment, 2.5V may be applied to the word line zero (WL0). In a block 408, the program line zero (PL0) may go active. In one embodiment, minus one volt (−1V) may be applied to the program line. In keeping with the example, applying two volts (2V) to the bit line zero (BL0), applying 2.5V to the word line zero (WL0), and applying minus one volt (−1V) to the program line zero (PL0) may program the antifuse cell 100 to a logic level low.

Applying two volts (2V) to the bit line zero (BL0) and applying minus one volt (−1V) to the program line zero (PL0) should not cause the antifuse cell 302 to become programmed to a logic level low. This is because although there are 2V on the source of the transistor 306 the word line one (WL1) is not active and thus the access transistor 306 is not turned on. If the access transistor 306 is not turned on, then the difference in potential between the gate of the antifuse transistor 308 and the source of the antifuse transistor 308 may be insufficient to blow the antifuse transistor 308.

Applying 2.5V to the word line zero (WL0) without and applying minus one volt (−1V) to the program line one (PL1) and without applying 2V to the bit line one (BL1) should not cause the antifuse cell 302 to become programmed to a logic level low. This is because although there are 2.5V on the gate of the transistor 310 and the difference in potential between the gate of the access transistor 310 and the source of the access transistor 310 may be sufficient to turn on the access transistor 310 and put 2V on the gate of the antifuse transistor 312 at shared node 313, in keeping with the example, because minus one volt (−1V) is not present on the program line one (PL1), the difference in potential between the gate of the antifuse transistor 312 and the source of the antifuse transistor 312 may be insufficient for the antifuse transistor 312 to blow the antifuse transistor 312.

The antifuse cell 306 should not be affected because to affect it, the word line one (WL1), the bit line one (BL1), or the program line one (PL1) without should be active. Since this is not the case according to the example, the difference in potential between the gate of the antifuse transistor 316 and the source of the antifuse transistor 316 may be insufficient for the antifuse transistor 316 to blow the antifuse transistor 316.

In a block 410, the antifuse cell 100 may be read by the sense amplifier 330.

In the embodiment illustrated in FIG. 3, the bit line zero (BL0), the program line zero (PL0), bit line one (BL1), and the program line one (PL1) are laid out in parallel in the antifuse array 300. Also, the word line zero (WL0) and the word line one (WL1) are laid out parallel to each other and perpendicular to the bit line zero (BL0), the program line zero (PL0), bit line one (BL1), and the program line one (PL1). In this embodiment, only one antifuse cell may be programmed at a time because the bit lines and programs lines are in parallel and multiple rows hang from the program lines.

Figure 5:
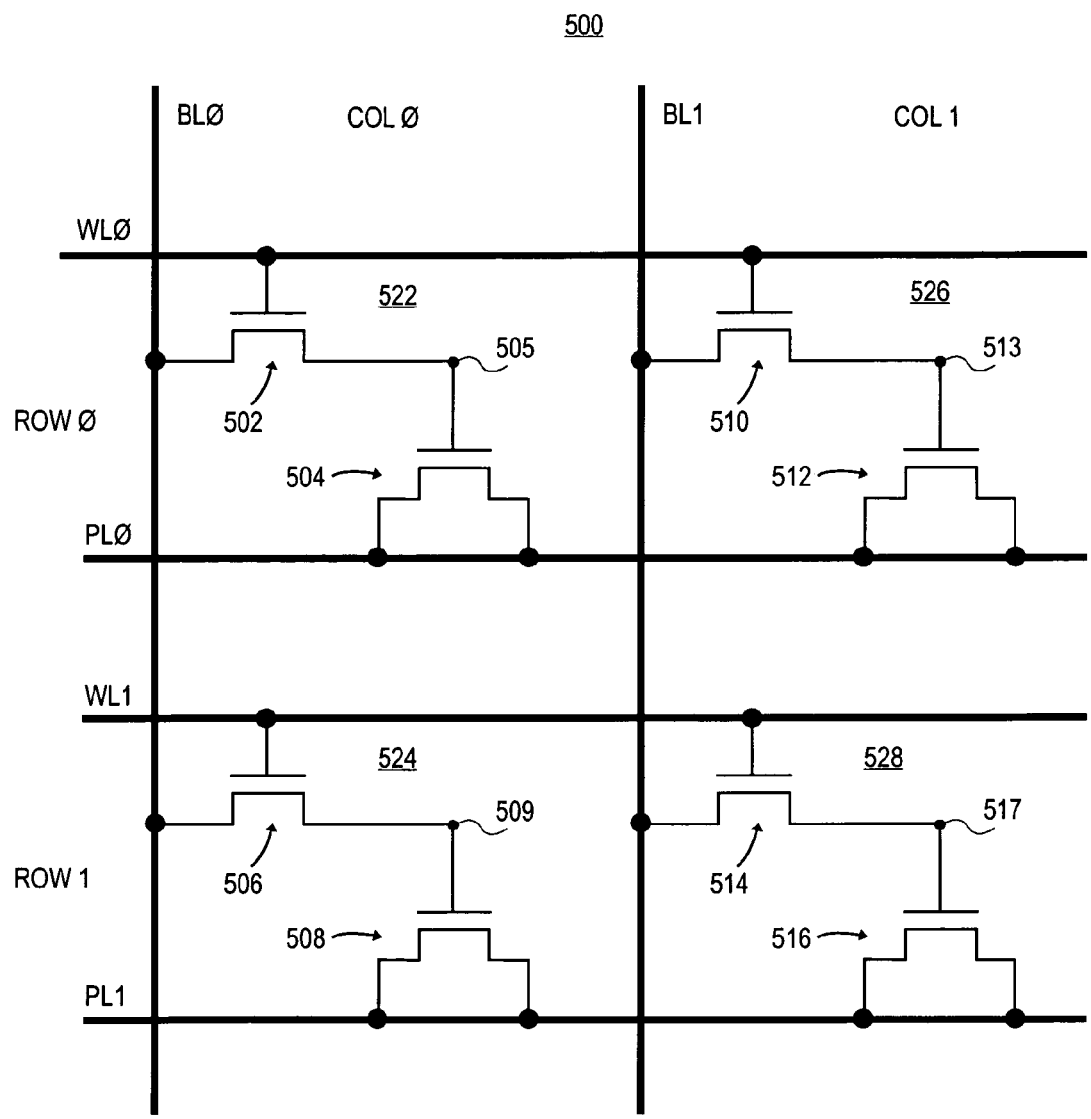
FIG. 5 is a schematic diagram of a one time programmable antifuse array according to an alternative embodiment of the present invention.

FIG. 5 is a schematic diagram of a dual gate oxide thickness one time programmable antifuse array 500 according to an alternative embodiment of the present invention in which several antifuse cells in a row may be programmed at the same time. In the illustrated embodiment, the antifuse array 500 includes four antifuse cells 522, 524, 526, and 528. The antifuse cells 522 and 526 are located in a row zero (Row 0). The antifuse cells 524 and 528 are located in a row one (Row 1). The antifuse cells 522 and 524 are located in a column zero (Col 0). The antifuse cells 526 and 528 are located in a column one (Col 1).

The antifuse cell 522 includes an access transistor 502 coupled to an antifuse transistor 504 via a shared node 505. The antifuse cell 524 includes an access transistor 506 coupled to an antifuse transistor 508 via a shared node 509. The antifuse cell 526 includes an access transistor 510 coupled to an antifuse transistor 512 via a shared node 513. The antifuse cell 528 includes an access transistor 514 coupled to an antifuse transistor 516 via a shared node 517.

In the illustrated embodiment, the drain of the transistor 502 is coupled to the gate of the transistor 504 and the transistors 502 and 504 share the shared node 505 at the transistor 502's drain and the transistor 504's gate. The transistors 506 and 508 share a node (shared node 509) at the transistor 506's drain and the transistor 508's gate, the transistors 510 and 512 share a node (shared node 513) at the transistor 510's drain and the transistor 512's gate, and the transistors 514 and 516 share a node (shared node 517) at the transistor 514's drain and the transistor 516's gate.

The bit line zero (BL0) is coupled to the source of the transistor 502 and to the source of the transistor 506. The word line zero (WL0) is coupled to the gate of the transistor 502 and to the gate of the transistor 510. The program line zero (PL0) is coupled to the source and the drain of the transistor 504, and to the source and the drain of the transistor 508.

The bit line one (BL1) is coupled to the source of the transistor 510 and to the source of the transistor 514. The word line one (WL1) is coupled to the gate of the transistor 506 and to the gate of the transistor 514. The program line one (PL1) is coupled to the source and the drain of the transistor 512, and to the source and the drain of the transistor 516.

In the embodiment illustrated in FIG. 5, the word line zero (WL0), the program line zero (PL0), word line one (WL1), and the program line one (PL1) are laid out in parallel in the antifuse array 500. Also, the bit line zero (BL0) and the bit line one (BL1) are laid out parallel to each other and perpendicular to the word line zero (WL0), the program line zero (PL0), word line one (WL1), and the program line one (PL1). In this embodiment, several antifuse cells in a row may be programmed at a time. For example, activating the word line zero (WL0) and the program line zero (PL0) enables each antifuse cell in row zero (Row 0) whose bit line (BL) is active to be programmed. Similarly, activating the word line one (WL1) and the program line one (PL1) enables each antifuse cell in row one (Row 1) whose bit line (BL) is active to be programmed.

Figure 6:
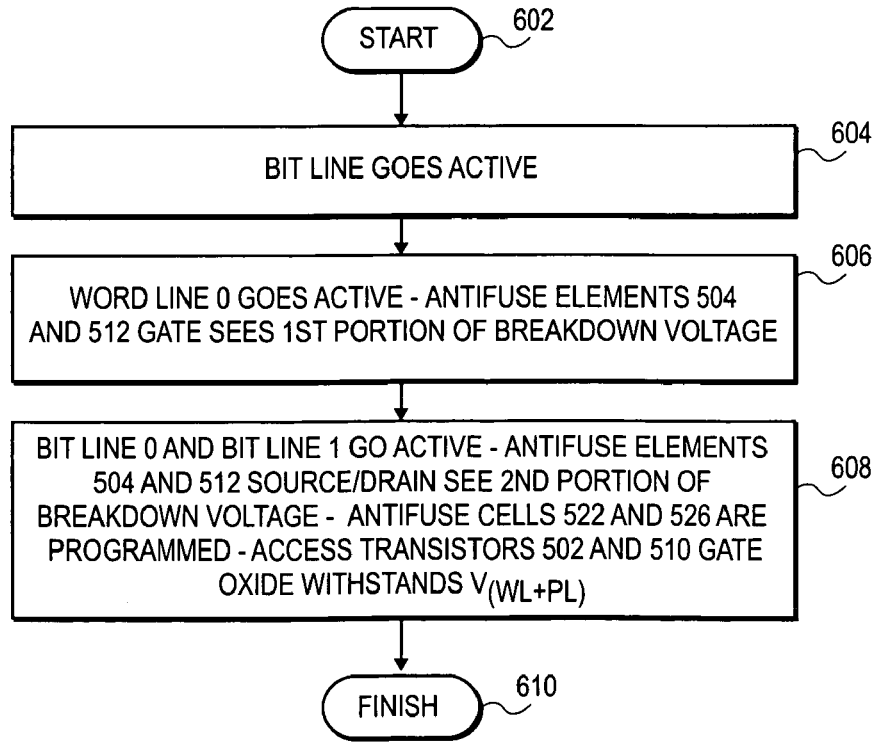
FIG. 6 is a flowchart illustrating a method of operating the array depicted in FIG. 5 according to an embodiment of the present invention.

To illustrate this point, refer to FIG. 6, which is a flowchart illustrating a method of operating the cell 500 according to an embodiment of the present invention. For purpose of illustration, assume that antifuse cells 522 and 524 are to be programmed and the antifuse cells 526 and 528 are not.

The method 600 begins with a block 602, where control passes to a block 604.

In block 604, the word line zero (WL0) may go active.

In a block 606, the program line zero (PL0) may go active and the antifuse elements 504 and 512 see the first portion of the breakdown voltage.

In a block 608, the bit line zero (BL0) and the bit line one (BL1) may go active and source/drain of the antifuse elements 504 and 512 see the second portion of the breakdown voltage. The program line zero (PL0) going active, bit line zero (BL0) going active, and the word line zero (WL0) going active ensure that the antifuse cells 522 and 524 are programmed but the antifuse cells 526 and 528 are not. The gate oxide of the access transistor 502 withstands the combination of the voltages on the word line zero (WL0) and program line zero (PL0). The gate oxide of the access transistor 510 also withstands the combination of the voltages on the word line zero (WL0) and program line zero (PL0).

In some embodiments, the program lines may be tied to a common program voltage.

The operations of the methods 200, 400, and 600 have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the methods 200, 400, and 600 are example methods and other methods may be used to implement embodiments of the present invention.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the methods 200, 400, and 600. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

The antifuse cell 100, the antifuse array 300, and/or the antifuse array 500 may be used in a variety of integrated circuit (IC) chips. Examples of these IC chips include, but are not limited to, processors, controllers, chip set components, programmable logic arrays (PLA), and memory chips.

Figure 7:
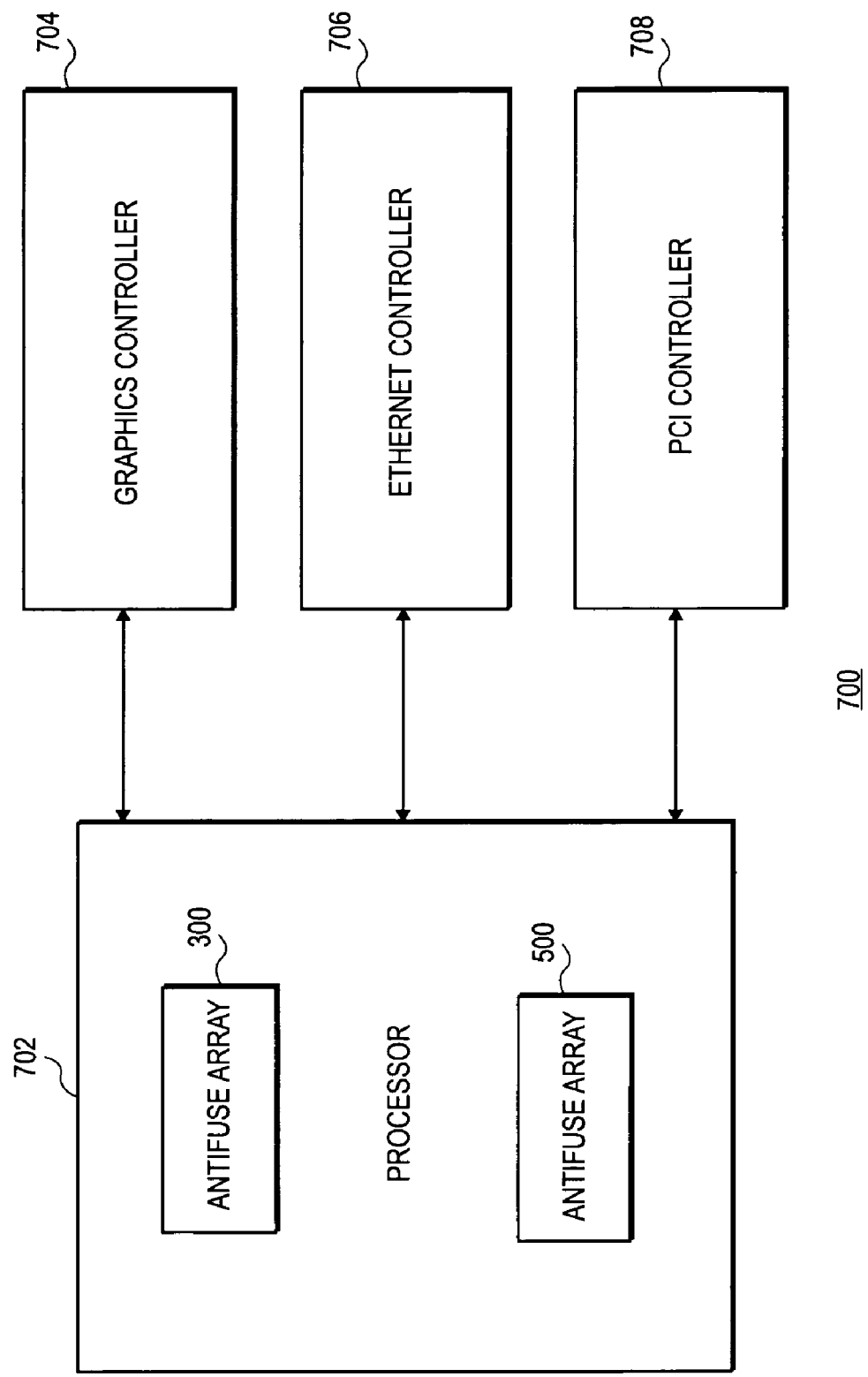
FIG. 7 is a high-level block diagram of a system according to an embodiment of the present invention.

FIG. 7 is a high-level block diagram of a system 700 according to an embodiment of the present invention in which the antifuse arrays 300 and 500 are used in an integrated circuit (IC) chip. In the illustrated embodiment, the example system 700 includes an integrated circuit 702 coupled to a graphics controller 704, an Ethernet controller 706, and a peripheral component interface (PCI) controller 708. The graphics controller 704 performs its conventional functions of receiving commands and data and generating display signals (e.g., in RGB format). The Ethernet controller 706 performs its conventional functions of connecting peripheral devices to an Ethernet bus or cable. The PCI controller 708 performs its conventional functions of interfacing the integrated circuit 702 to a PCI bus hierarchy.

Figure 8:
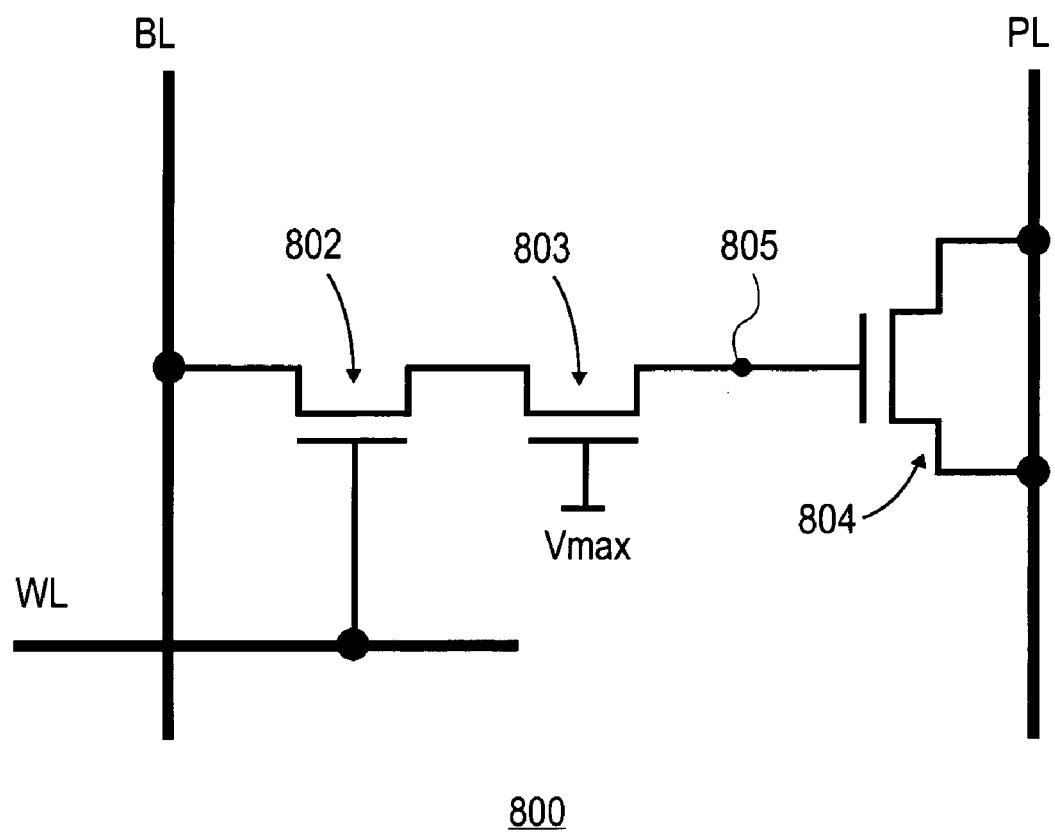
FIG. 8 is a schematic diagram of a one time programmable antifuse cell according to an alternative embodiment of the present invention.

FIG. 8 is a schematic diagram of a one time programmable antifuse cell 800 according to an alternative embodiment of the present invention. In the illustrated embodiment, the antifuse cell 800 includes a transistor 802 coupled to a transistor 804. A bit line (BL) is coupled to the source of the transistor 802. The drain of the transistor 802 is coupled to the source of the transistor 803. The drain of the transistor 803 is coupled to the gate of the transistor 804. A program line (PL) is coupled to the source and the drain of the transistor 804. The transistors 803 and 804 share the node 805 (shared node 805) at the transistor 803's drain and the transistor 804's gate. The transistors 802, 803, and 804 may be MOS field effect transistors (MOSFETs).

A word line (WL) is coupled to the gate of the transistor 802. The gate of the transistor 803 is coupled to a maximum operating voltage (Vmax) of the thin gate oxide.

In the illustrated embodiment, the example transistors 802 and 803 are NMOS access transistors in cascade series coupled and both may be thick gate oxide transistors. Although the transistors 802 and 803 are thick gate oxide transistors, in this embodiment, they may be operated with thin gate oxide lower voltages to make sure the sense circuit and sense amp can be operated normally. For example, 0V or ground may be applied to the bit line BL and the thin gate oxide operating supply voltage may be applied to the word line (WL) to turn on the access transistor 802. The second access transistor 803 is always on.

The program voltage of, for example, +3V may be applied to the source/drain of the antifuse transistor 804 via the program line (PL). In this manner, all the programming voltage is supplied through program line (PL) and once the gate oxide of the antifuse transistor 804 is broken, the gate of the antifuse transistor 804 (i.e. the shared node 805) will see +3V, which in keeping with the example is the junction breakdown voltage of the technology. The +3V on the shared node 805 reverse biases the diode between the drain and body of second access transistor 803, which can be accommodated because of the thick gate oxide of the access transistor 803.

The transistors 102, 104, 310, 312, 306, 308, 314, 316, 502, 504, 506, 508, 510, 512, 514, 516, 802, 803, and 804 may be MOS field effect transistors (MOSFETs). Although the transistors 102, 104, 310, 312, 306, 308, 314, 316, 502, 504, 506, 508, 510, 512, 514, 516, 802, 803, and 804 are illustrated as n-type MOSFETs (NMOS transistors), embodiments of the present invention are not so limited. For example, in some embodiments the transistors 102, 104, 310, 312, 306, 308, 314, 316, 502, 504, 506, 508, 510, 512, 514, 516, 802, 803, and 804 may be p-type MOSFETs (PMOS transistors).

Figure 9:
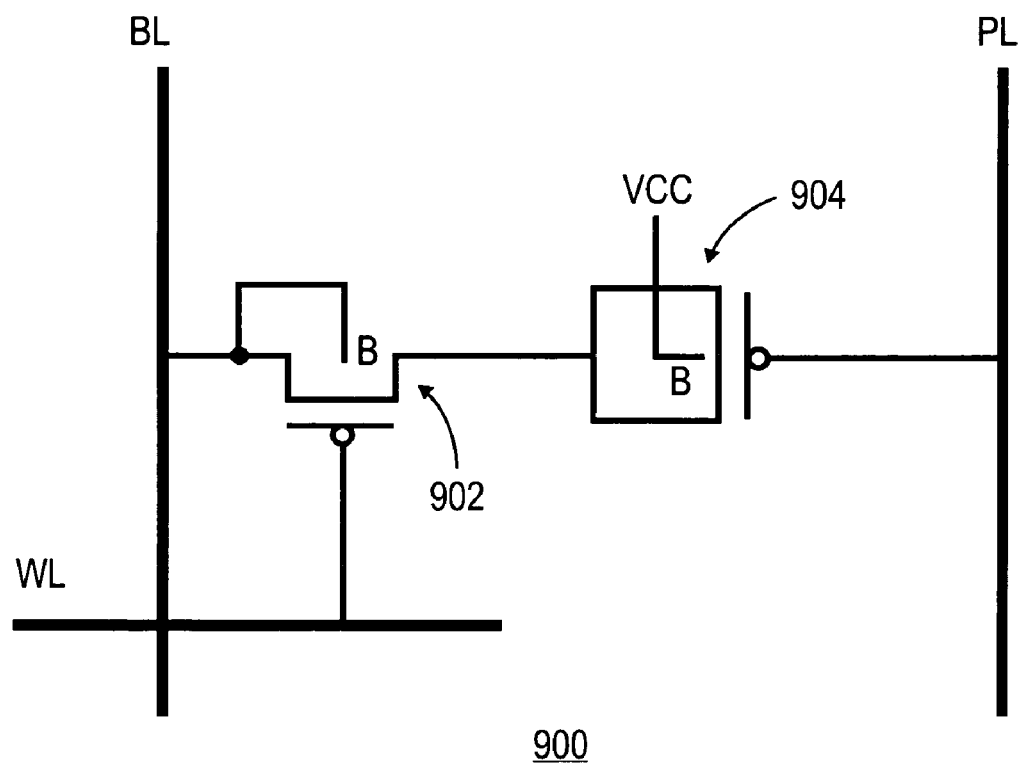
FIG. 9 is a schematic diagram of a one time programmable antifuse cell according to still another embodiment of the present invention.

FIG. 9 is a schematic diagram of a dual gate oxide thickness one time programmable antifuse cell 900 according to an embodiment of the present invention in which the transistors are PMOS transistors. In the illustrated embodiment, the antifuse cell 900 includes a PMOS transistor 902 coupled to a PMOS transistor 904. In the illustrated embodiment, the example transistor 902 is the access transistor and the transistor 904 is the antifuse element.

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
 a one-time programmable cell having:
  an access transistor;
  an antifuse element coupled to the access transistor, wherein the access transistor includes a gate having a gate oxide thickness and the antifuse element includes a gate having gate oxide thickness, wherein the gate oxide thickness of the access transistor is greater than the gate oxide thickness of the antifuse element;
 a word line coupled to a gate of the access transistor;
 a bit line coupled to a source of the access transistor; and
 a program line coupled to a source and a drain of the antifuse transistor, wherein a drain of the access transistor is coupled to the gate of the antifuse element.

2. The apparatus of claim 1, wherein the access transistor is to couple a first voltage to the gate of the antifuse element and the program line is to couple a second voltage to the source and/or drain of the antifuse element, and wherein application of the first and the second voltages to the antifuse element is to cause the gate oxide of the antifuse element to break down.

3. The apparatus of claim 2, wherein application of a third voltage to the drain of the access transistor and the gate of the antifuse element caused by breakdown of the gate oxide of the antifuse element is insufficient to cause the breakdown of the gate oxide of the access transistor.

4. The apparatus of claim 1, wherein the antifuse element comprises a metal oxide semiconductor field effect transistor (MOSFET).

5. A method, comprising:
 programming a one time programmable cell by:
  applying a first voltage on a bit line coupled to a source of an access transistor;
  applying a second voltage to a word line coupled to a gate of the access transistor, wherein a difference in potential across the gate and the source of the access transistor caused by the first and the second voltages, respectively, results in a third voltage being present on a drain of the access transistor and on a gate of an antifuse element; and
  applying a fourth voltage to a program line coupled to a source and to a drain of the antifuse element, wherein a difference in potential across the gate and the source of the antifuse element caused by the third and the fourth voltages, respectively, is sufficient to cause a gate oxide in the antifuse element to breakdown and is insufficient to cause a gate oxide in the access transistor to breakdown.

6. The method of claim 5, further comprising applying a fifth voltage to the drain of the access transistor and the gate of the antifuse element caused by breakdown of the gate oxide of the antifuse element.

7. The method of claim 6, wherein a difference in potential across the gate and the drain of the access transistor caused by the second voltage and a fifth voltage, respectively, is insufficient to cause a gate oxide in the access transistor to breakdown.

8. The method of claim 5, further comprising sensing a voltage on the bit line.

9. An apparatus, comprising:
a first word line and a second word line coupled to gates of access transistors in a first row of cells and a second row of cells, respectively, of an array of one-time programmable cells;
a first bit line and a second bit line coupled to sources of access transistors in a first column of cells and a second column of cells, respectively, of the array of one-time programmable cells; and
a first program line and a second program line coupled to sources and drains of antifuse elements in the first and second columns, respectively, of the array of one-time programmable cells, wherein the access transistors and antifuse elements in the array include gate oxide thicknesses, wherein the gate oxide thicknesses of the access transistors are greater than the gate oxide thicknesses of the antifuse elements.

10. The apparatus of claim 9, wherein a combination of a first voltage applied to the first word line, a second voltage applied to the first bit line, and a third voltage applied to the first program line causes the cell located in the first column, first row to be programmed.

11. The apparatus of claim 10, wherein the combination of the first voltage applied to the first word line, the second voltage applied to the first bit line, and the third voltage applied to the first program line is insufficient to cause the cell located in the first row and the second column to be programmed.

12. The apparatus of claim 10, wherein the combination of the first voltage applied to the first word line, the second voltage applied to the first bit line, and the third voltage applied to the first program line is insufficient to cause the cell located in the second row and the first column to be programmed.

13. The apparatus of claim 10, wherein the combination of the first voltage applied to the first word line, the second voltage applied to the first bit line, and the third voltage applied to the first program line is insufficient to cause the cell located in the second row and the second column to be programmed.

14. An apparatus, comprising:
a first word line and a second word line coupled to gates of access transistors in a first row of cells and a second row of cells, respectively, of an array of one-time programmable cells;
a first bit line and a second bit line coupled to sources of access transistors in a first column of cells and a second column of cells, respectively, of the array of one-time programmable cells; and
a first program line and a second program line coupled to sources and drains of antifuse elements in the first and second rows, respectively, of the array of one-time programmable cells, wherein the access transistors and antifuse elements in the array include gate oxide thicknesses, wherein the gate oxide thicknesses of the access transistors are greater than the gate oxide thicknesses of the antifuse elements.

15. The apparatus of claim 14, wherein a combination of a first voltage applied to the first word line, a second voltage applied to the first program line, and a third voltage applied to the first and the second bit lines causes the cells located in the first column, first row and in the second column, first row to be programmed.

16. The apparatus of claim 14, wherein the combination of the first voltage applied to the first word line, the second voltage applied to the first program line, and the third voltage applied to the first and the second bit lines is insufficient to cause the cells located in the second row to be programmed.

17. A system, comprising:
an integrated circuit having a one-time programmable cell having an access transistor and an antifuse element coupled to the access transistor, wherein the access transistor includes a gate having a gate oxide thickness and the antifuse element includes a gate having gate oxide thickness, wherein the gate oxide thickness of the access transistor is greater than the gate oxide thickness of the antifuse element, wherein a word line is coupled to a gate of the access transistor, a bit line is coupled to a source of the access transistor, and a program line is coupled to a source and a drain of the antifuse transistor, and a drain of the access transistor is coupled to the gate of the antifuse element; and
a graphics controller coupled to the integrated circuit.

18. The apparatus of claim 17, wherein the integrated circuit is a processor.

19. The system of claim 17, wherein the antifuse element is a metal oxide semiconductor field effect transistor (MOSFET).

* * * * *